(12) United States Patent
Schindler et al.

(10) Patent No.: US 6,323,513 B1
(45) Date of Patent: Nov. 27, 2001

(54) SEMICONDUCTOR COMPONENT HAVING AT LEAST ONE CAPACITOR AND METHODS FOR FABRICATING IT

(75) Inventors: Günther Schindler; Walter Hartner, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/449,716

(22) Filed: Nov. 24, 1999

(30) Foreign Application Priority Data

Nov. 25, 1998 (DE) ................................ 198 54 418

(51) Int. Cl.$^7$ ................. H01L 27/108; H01L 29/76; H01L 29/94; H01L 31/119
(52) U.S. Cl. .................. 257/296; 257/295; 257/306
(58) Field of Search .................... 257/295–310, 257/314–316; 438/396–398, 253–254

(56) References Cited

U.S. PATENT DOCUMENTS

| 5,579,258 | 11/1996 | Adach . |
| 5,615,144 | 3/1997 | Kimura et al. . |
| 5,625,529 | 4/1997 | Lee et al. . |
| 6,069,381 | * 5/2000 | Black et al. ................. 257/316 |

FOREIGN PATENT DOCUMENTS

| 196 36 054 A1 | 3/1997 | (DE) . |
| 0 516 031 A1 | 12/1992 | (EP) . |

* cited by examiner

Primary Examiner—Tom Thomas
Assistant Examiner—Cuong Q Nguyen
(74) Attorney, Agent, or Firm—Herbert L. Lerner; Laurence A. Greenberg; Werner H. Stemer

(57) ABSTRACT

A semiconductor component has a capacitor and a resistor with a given resistance connected in parallel. The resistance of the resistor is lower than the resistance of the ferroelectric capacitor dielectric in order to prevent an undesired charging of the capacitor electrodes relative to one another. Methods for fabrication a semiconductor component having a capacitor and a resistor are also provided.

15 Claims, 8 Drawing Sheets

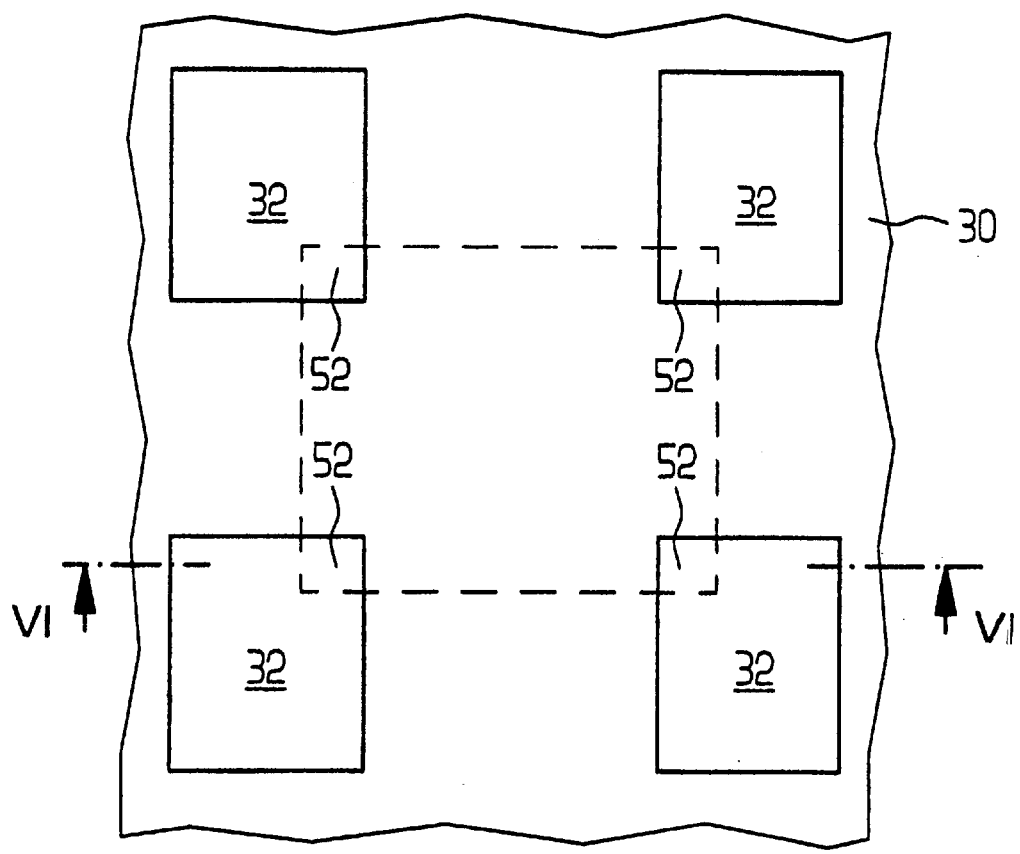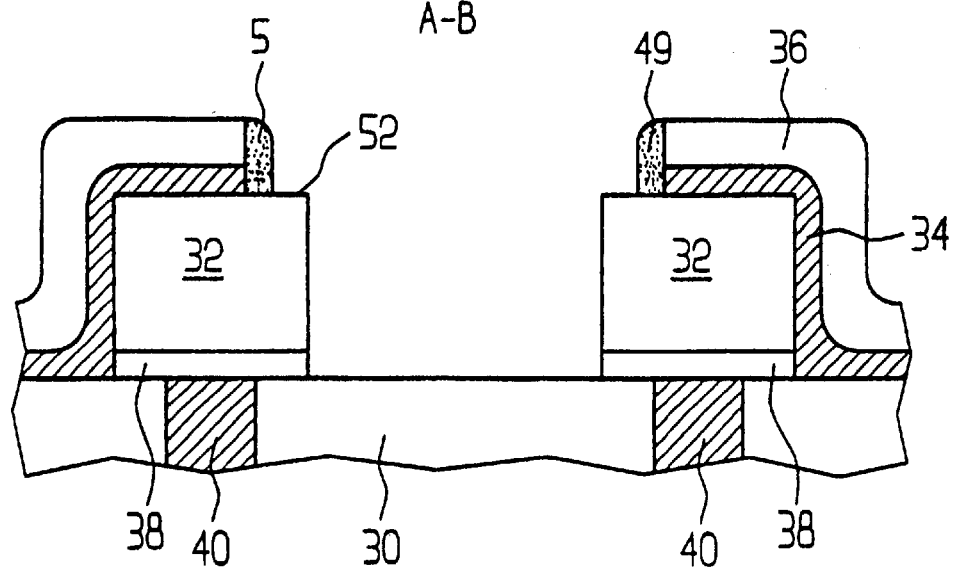

SEMICONDUCTOR COMPONENT HAVING AT LEAST ONE CAPACITOR AND METHODS FOR FABRICATING IT

BACKGROUND OF THE INVENTION

FIELD OF THE INVENTION

The invention lies in the field of semiconductor technology and relates to a semiconductor component having at least one capacitor. The capacitor has a metal oxide layer between a first and a second electrode. A remanent electrical polarization can be generated in the metal oxide layer by supplying a given voltage difference between the first and second electrodes.

Among other memory devices, so-called nonvolatile memories are proposed for future generations of semiconductor memories. In these nonvolatile memories, the individual memory cells each include a capacitor having a ferroelectric layer as the capacitor dielectric. In this layer, a remanent polarization of the ferroelectric material can be brought about by applying an electric field. It is thus possible to store information in the capacitor depending on the direction of the polarization. Since, unlike in the so-called DRAMs, the information is not stored by accumulated charges, there is also no risk of self-discharge of the capacitor and thus there is no risk of the information disappearing. The polarization produced in the ferroelectric is preserved, in principle, for an infinite time period, which is why such memories are also called nonvolatile memories.

A semiconductor component of the type mentioned above and which contains nonvolatile memory elements is described in U.S. Pat. No. 5,615,144, for example. The memory cells disclosed therein each include a ferroelectric capacitor, one of whose two electrodes is connected to a bit line via a selection transistor. The other electrode is connected to a so-called plate line on which a pulse signal is present. With the selection transistor open, one electrode of the capacitor is brought to the potential of the bit line that is now connected to it. Depending on the signals on the bit line and plate line, the electric field acting on the capacitor dielectric is altered and the orientation and level of the remanent polarization are thus affected.

With the selection transistor closed, one electrode of the capacitor is disconnected from the bit line. It has been shown, however, that this capacitor electrode is electrostatically charged relative to the other electrode as a result, for example, of leakage currents from adjacent cells or of the closed selection transistor, and can thus contribute to an undesired erasure of the polarization or polarization reversal of the capacitor dielectric. This however leads to an irreversible loss of data which must be avoided.

SUMMARY OF THE INVENTION

It is accordingly an object of the invention to provide a semiconductor component which overcomes the above-mentioned disadvantages of the heretofore-known components of this general type and in which undesired alterations or changes of the stored information are avoided. It is furthermore an object of the invention to provide a method for fabricating a semiconductor component of this type.

With the foregoing and other objects in view there is provided, in accordance with the invention, a semiconductor component, including a capacitor having a first electrode, a second electrode, and a metal oxide layer disposed between the first electrode and the second electrode, the metal oxide layer having a first resistance and being remanently electrically polarizable by a given voltage difference between the first electrode and the second electrode; and a resistance element disposed at the capacitor and electrically connecting the first electrode to the second electrode, the resistance element having a second resistance smaller than the first resistance.

In the case of a semiconductor component of the type mentioned above, the first-mentioned object is achieved according to the invention by providing at least one resistance element at the capacitor. The resistance element electrically connects the first electrode to the second electrode and has a predetermined resistance or resistance value, which is lower than the resistance of the metal oxide layer.

The basic concept of the invention is to connect a defined short-circuiting element parallel with the capacitor so that accumulated charges can flow away via this element and, consequently, a potential equalization is brought about between the two capacitor electrodes. The predetermined resistance of the resistance element or of the short-circuiting element should in this case be dimensioned such that, on the one hand, the desired bringing about of the polarization in the event of the addressing of the capacitor is impeded only to an insignificant extent and, on the other hand, a sufficient potential equalization can be effected in the event of a non-addressing. The level of the resistance of the resistance element must therefore be determined by an overall consideration of the electrical circuit that is realized. An essential aspect in this case is that in the event of the remanent polarization being written in, the required voltage is dropped virtually completely across the capacitor and the resistance element, which is connected in parallel with the capacitor. In other words, the total resistance formed from these two elements is still considerably higher than the sum of all the line resistances and of the transistor resistance (with the transistor open). Thus, the resistance element must be dimensioned in such a way that the voltage pulse for bringing about the remanent polarization, as seen over its entire time duration, leads to an electric field which acts effectively on the capacitor dielectric and suffices to bring about a remanent (residual, permanent) electrical polarization in the capacitor dielectric.

On the other hand, the resistance of the resistance element should be low enough to enable the potential equalization of the two electrodes of the capacitor in the event of an unintentional charging of the first and second electrodes relative to one another. Since electrostatic charging of the electrodes, in contrast to the time duration of the preselected voltage difference for bringing about the remanent electrical polarization, takes place essentially significantly more slowly, the magnitude of the resistance of the resistance element can be calculated relatively easily with regard to the required conditions. Thus, this resistance should be lower than the resistance of the metal oxide layer and enable the capacitor to be discharged with a time constant which is at least ten times longer than the time duration for bringing about the remanent polarization. An expedient magnitude of the resistance of the resistance element lies approximately between 1 M$\Omega$ and 100 G$\Omega$, a magnitude between 10 M$\Omega$ and 100 M$\Omega$ being preferred.

In the case of a plurality of memory cells, for example in the case of ferroelectric RAMs, each memory cell preferably has its own resistance element. This assignment is also expedient in the case of memory cells in which the second electrodes are formed by a common metal layer.

In a preferred embodiment, the resistance element is fabricated from polysilicon or from a conductive nitride or silicide, for example a metal silicide. In this case, the resistance of the resistance element, that is to say its effective overall or total resistance, can be set by a suitable doping and/or suitable geometrical dimensioning (effective cross sectional area).

The resistance element is preferably configured as a self-aligned lateral edge web or edge layer on at least one side area or side face of the metal oxide layer. In a further preferred embodiment, the resistance element is formed by a contact hole filled with conductive material in the metal oxide layer. A further possibility for forming a resistance element is to form the resistance element from a layer made of conductive material which covers the entire top side of the first electrode. At least on a side area or side face of the first electrode, this layer covers the second electrode which is applied at the side area with the metal oxide layer being interposed.

In the aforementioned preferred exemplary embodiments, the resistance element is fabricated by applying and patterning or structuring an additional layer. In contrast to this, in a further preferred embodiment, the resistance element can also be formed by at least one region of the metal oxide layer, the region having an altered resistance. In this case, care must be taken to ensure that the metal oxide layer is altered only locally, in order to preclude degeneration of the desired electrical properties of the metal oxide layer (level of the remanent polarization). A region of the metal oxide layer altered in such a way can be brought about for example by indiffusion of at least one diffusion substance. In this case, this diffusion substance may be a metal already contained in the metal oxide layer. In this case, the stoichiometric ratios in the metal oxide layer are altered locally and, as a result, the conductivity of the metal oxide layer is increased in these regions.

The choice of which diffusion substances are to be used depends inter alia on the metal oxide layer used. The metal oxide layers used are preferably ferroelectric metal oxides such as, for example, strontium bismuth tantalate ($SrBi_2Ta_2O_9$, SBT), niobium-doped strontium bismuth tantalate ($SrBi_2Ta_{2-x}Nb_xO_9$, SBTN), lead zirconium titanate ($PbTiO_3$, PZT) or derivatives thereof. If the diffusion substance is intended to be a metal already contained in the metal oxide layer, it is thus selected from the group bismuth, strontium, niobium, lead, zirconium, titanium, and tantalum. If, on the other hand, an impurity substance or foreign substance is preferred as the diffusion substance, then it is possible to use for example ruthenium, iron or tantalum or titanium.

It is furthermore advantageous to produce the resistance elements in a self-aligned manner directly at the capacitor, as a result of which the space requirement of the memory cell is increased only insignificantly or not at all. At the same time, the integration of the resistance element entails only a minimal additional process complexity and processes that are technologically well controlled are used.

It is also advantageous to produce that region of the metal oxide layer which has an altered resistance by ion implantation. To that end, ions are implanted essentially in a locally delimited region of the metal oxide layer and subsequently activated through the use of a suitable heat treatment. This advantageously allows the relatively simple formation of the resistance element in the metal oxide layer.

In accordance with another feature of the invention, at least one metal selected from bismuth, strontium, niobium, lead, tantalum, titanium, ruthenium, iron, or zirconium is used for the ion implantation.

The second above-mentioned object is achieved through the use of a method for fabricating a semiconductor component having at least one capacitor, in which a metal oxide layer is disposed between a first and a second electrode and in which a resistance element is provided. The method includes the following steps:

applying an electrode material and a metal oxide-containing layer to a substrate surface;

selectively etching the electrode material and the metal oxide-containing layer thus forming the first electrode with the metal oxide layer disposed above it;

conformally applying a conductive material having a predetermined material thickness;

anisotropically etching the conductive material to produce a resistance element in the form of a self-aligned lateral edge web on at least one sidewall or side flank of the metal oxide layer and of the first electrode; and applying an electrode material for the purpose of forming a second electrode.

According to this method, after the formation of the first electrode with a metal oxide layer disposed above it, at least one resistance element is formed in the form of a self-aligned lateral edge web on a sidewall of the metal oxide layer and of the electrode. The electrode material and the metal oxide-containing layer from which the first electrode and the metal oxide layer are formed may in this case be etched one after the other or in a common etching step.

The object of the invention is furthermore achieved through the use of a method for fabricating a semiconductor component having at least one capacitor, in which a metal oxide layer is situated between a first and a second electrode and in which a resistance element is provided. The method includes the steps of:

applying an electrode material to a substrate surface;

etching the electrode material in given regions and forming the first electrode;

conformally applying a metal oxide-containing layer for the purpose of forming the metal oxide layer;

applying an electrode material for the purpose of forming the second electrode;

etching through the second electrode and the metal oxide layer in given regions thus forming a contact hole reaching down to the first electrode; and filling this contact hole with a conductive material for the purpose of forming a resistance element.

As a result of this, the resistance element is formed in the form of a contact hole at least in the metal oxide layer. In this case, it is possible to form the contact hole directly in the metal oxide layer and to fill it with a suitable material, or to produce the contact hole only after forming the second electrode in a common etching step in the latter and in the metal oxide layer.

The object of the invention is also achieved by a method for fabricating a semiconductor component having at least one capacitor, in which a metal oxide layer is disposed between a first and a second electrode and in which a resistance element is provided. The method includes following steps:

applying an electrode material to a substrate surface;

selectively etching the electrode material and thus forming the first electrode;

conformally applying a metal oxide-containing layer for the purpose of forming the metal oxide layer;

applying an electrode material for the purpose of forming the second electrode;

removing the metal oxide layer and the second electrode at least in given regions from a top side of the first electrode; and conformally applying a conductive material having a predetermined material thickness, which forms the resistance element as a result of the contact with the top side of the first electrode and the second electrode.

This method thus serves to form the resistance element in the form of a layer that covers the top side of the first electrode at least in given regions. If the metal oxide layer and the second electrode are removed completely from the top side of the first electrode, the conductive material (resistance element) completely covers the surface and at least some side regions of the first electrode, the metal oxide layer and the second electrode being disposed at the side regions of the first electrode between the conductive material and the first electrode.

It is also possible, however, to produce the resistance element in the form of a self-aligned lateral edge web on the top side of the first electrode, this edge web being formed on the side of the metal oxide layer, which has been removed in given regions from the top side of the first electrode, and of the second electrode.

In accordance with another mode of the invention, the conductive material is anisotropically etched for forming a self-aligned lateral edge web remaining on the top side of the first electrode and on a side surface of the metal oxide layer and of the second electrode, that has been formed with the removing step. The self-aligned lateral edge web then forms the resistance element.

A further method which achieves the above-mentioned object of fabricating a semiconductor component having at least one capacitor, in which a metal oxide layer is situated between a first and a second electrode and in which a resistance element is provided, has the following method steps:

applying a diffusion layer containing at least one diffusion substance to a substrate surface;

applying an electrode material to this layer;

etching the electrode material in given regions thus forming the first electrode and etching the diffusion layer in given regions;

conformally applying a metal oxide-containing layer for the purpose of forming the metal oxide layer;

applying an electrode material for the purpose of forming the second electrode; and performing a heat treatment in the course of which the diffusion substance diffuses from the diffusion layer at least partly into the metal oxide layer thus forming the resistance element.

In this method, first of all a diffusion layer containing a diffusion substance is applied, wherein this layer makes contact, at least in certain regions, with the metal oxide layer that is to be formed later. As a result of the final heat treatment, the diffusion substance or substances diffuses or diffuse from the diffusion layer into the metal oxide layer and forms or form there, at least in the vicinity of the contact regions between the diffusion layer and the metal oxide layer, at least one region having a higher conductivity than the rest of the metal oxide layer, which is not doped. This region then constitutes the resistance element. It is advantageous in this case that the diffusion takes place only in certain regions and, consequently, the electrical properties sought for the rest of the metal oxide layer, in particular with regard to the remanent electrical polarization, are not influenced.

If the contact region between the diffusion layer and the metal oxide layer is intended to be enlarged in order to assist the diffusion, after the etching of the electrode material for the purpose of forming the first electrode, a conformal sacrificial layer is deposited and is subsequently etched anisotropically and thus an edge web disposed directly laterally next to the first electrode is formed. During the subsequent etching of the diffusion layer, this edge web that has remained at the side regions of the first electrode serves, together with the first electrode, as an etching mask, with the result that the etched diffusion layer consequently protrudes by the width of the conformal sacrificial layer (width of the edge web) from under the first electrode. The edge web is subsequently removed completely. During the subsequent deposition of the metal oxide-containing layer, the protruding regions of the diffusion layer are thus also covered by the metal oxide-containing layer and a larger contact region is formed between the two. The thickness of the sacrificial layer depends on the desired size of this contact region and ultimately on the size of the conductive region produced by the heat treatment in the metal oxide layer.

The above-mentioned object is furthermore achieved by a method for fabricating a semiconductor component having at least one capacitor, in which a metal oxide layer is situated between a first and a second electrode and in which a resistance element is provided. The method includes the following steps:

applying an electrode material to a substrate surface;

applying a metal oxide-containing layer to the electrode material;

applying a further electrode material to the metal oxide-containing layer;

removing the two electrode materials and the metal oxide-containing layer at least in given regions thus forming a layer stack including the lower electrode, the metal oxide layer and the second electrode; and implanting ions at least into the metal oxide layer.

In this method, the resistance element is preferably fabricated by lateral implantation into the metal oxide layer. The implantation may be effected from one side or from all sides into the metal oxide layer, wherein with the latter variant the metal oxide layer, that is to say the entire layer stack, is moved as uniformly as possible about an axis of rotation disposed essentially perpendicularly to the layer stack. The substances used for implantation are preferably selected from the group of the diffusion substances specified above.

Other features which are considered as characteristic for the invention are set forth in the appended claims.

Although the invention is illustrated and described herein as embodied in a semiconductor component having at least one capacitor, and methods for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6a is a fragmentary top view of a semiconductor structure illustrating method steps for forming the resistance element on a partially uncovered top side of the first electrode;

FIG. 6b is a fragmentary cross-sectional view of the semiconductor structure of FIG. 6a along the line VI—VI;

DESCRIPTION OF THE PREFERRED EMBODIMENTS

Figure 1:
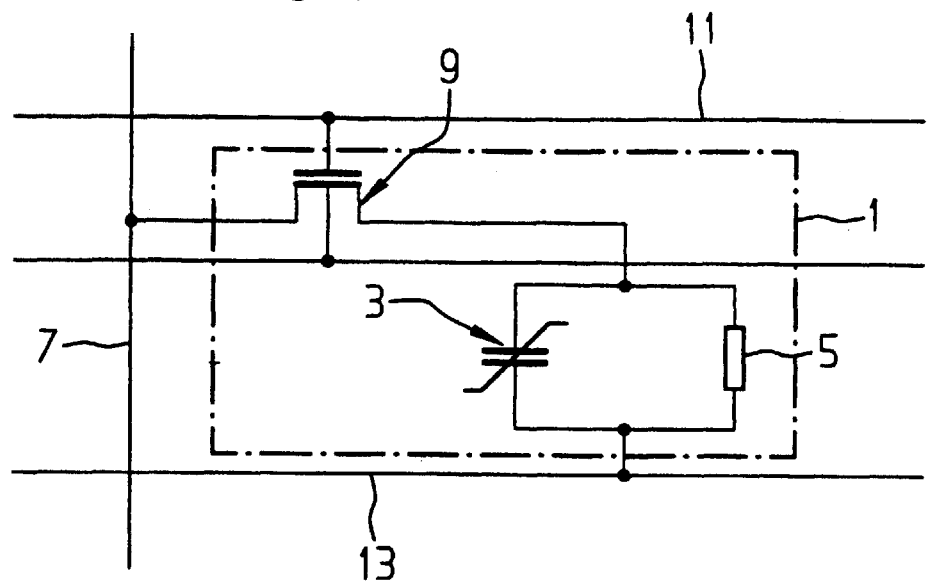
FIG. 1 is a schematic circuit diagram of a memory cell having a ferroelectric capacitor.

Referring now to the figures of the drawings in detail and first, particularly, to FIG. 1 thereof, there is shown an electrical circuit diagram of a memory cell 1. The memory cell includes a ferroelectric capacitor 3, a resistor 5 connected in parallel with the capacitor 3, and a selection transistor 9 connecting the capacitor 3 to the bit line 7. The selection transistor 9 is driven via a word line 11. The capacitor 3 and the resistor 5 are furthermore connected to the so-called plate line 13. A square wave signal is present on the plate line and periodically brings one electrode of the capacitor to a high voltage value. With the selection transistor 9 open, the other electrode of the capacitor 3 is connected to the bit line 7. Depending on the signal present thereon, that electrode of the capacitor 3 which is connected to the bit line 7 has either a higher or lower voltage than the electrode connected to the plate line 13, with the result that an electric field having a predetermined level and sign acts on the capacitor dielectric. Depending on its field strength, the electric field causes a remanent polarization in the capacitor dielectric of the capacitor 3. The resistor 5 connected in parallel reduces the effectively acting voltage difference, and thus the electric field, only to an insignificant extent, with the result that the applied voltage is dropped essentially completely across the capacitor 3.

If the memory content, that is to say the direction of the written-in polarization, is to be read out, a predetermined value is written to the capacitor 3 and the current required to do this is measured. If the capacitor already had the polarization to be written in, only a small current flows. If, however, the polarization of the capacitor has to be reversed, a correspondingly high current flow is recorded. The level of the measured current flow provides information about the memory content. Since the latter is altered during the read-out, it must subsequently be written in anew. The resistor 5 connected in parallel must not lead to an incorrect measurement during the read-out of the memory content, that is to say it must be dimensioned such that the current flowing through the resistor 5 in the case of the applied measurement voltage is still significantly smaller than the current flow required to reverse the polarization of the capacitor 3. By way of example, the resistance should be approximately at least a tenth smaller than the resistance of the metal oxide layer, but should not fall below a value of approximately 1 MΩ.

Figure 2:
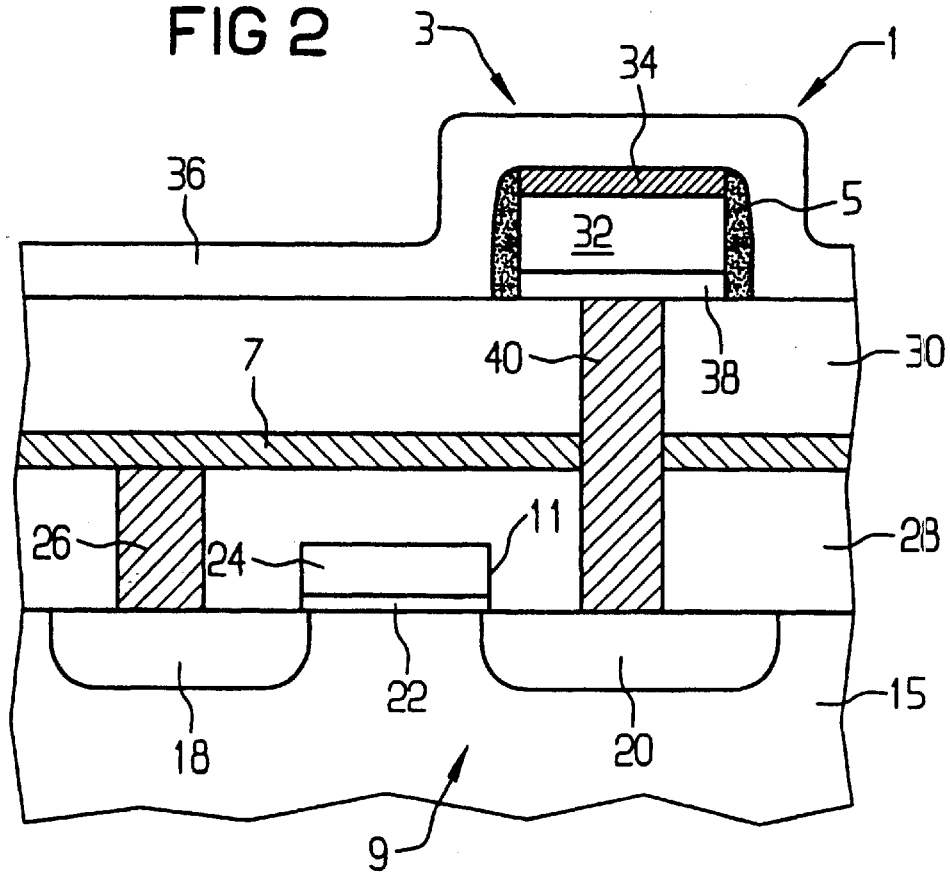
FIG. 2 is a fragmentary cross-sectional view of a memory cell having an integrated resistance element.

A preferred configuration of a memory cell 1 is shown in FIG. 2. A source region 18 and a drain region 20 of the selection transistor 9 are integrated at a distance from one another in a silicon substrate 15. A gate dielectric 22 and a gate electrode 24 are situated between the source region 18 and the drain region 20 on the silicon substrate 15. The gate electrode is connected to the word line 11. The source region 18 is connected to the bit line 7 via a contact hole 26, which is filled with a conductive material and situated in a first planarizing layer 28. A second planarizing layer 30, which constitutes the substrate 30 in the text below, is situated above the bit line 7 and the first planarizing layer 28. Disposed on the substrate 30 is the capacitor 3 with the resistance element 5 disposed on the sidewalls of the capacitor. In this case, the capacitor 3 includes a first (lower) electrode 32, a metal oxide layer 34 and a second (upper) electrode 36. A barrier layer 38 is furthermore situated between the first electrode 32 and the substrate 30. The barrier layer is intended to prevent a diffusion of the electrode material into the contact hole 40, which is situated underneath the barrier layer 38, penetrates through the substrate 30 and the first planarizing layer 28 and is filled with a conductive material. The contact hole 40 leads down to the drain region 20. As a result, the first electrode 32 of the capacitor 3 is connected to the selection transistor 9. The barrier layer 38 preferably includes a titanium/titanium nitride layer combination. Platinum is preferably used as the electrode material for the first and second electrodes 32 and 36, and SBT, on the other hand, for the metal oxide layer 34. The resistance element 5 is preferably formed of polysilicon in the present exemplary embodiment.

Figure 3A:
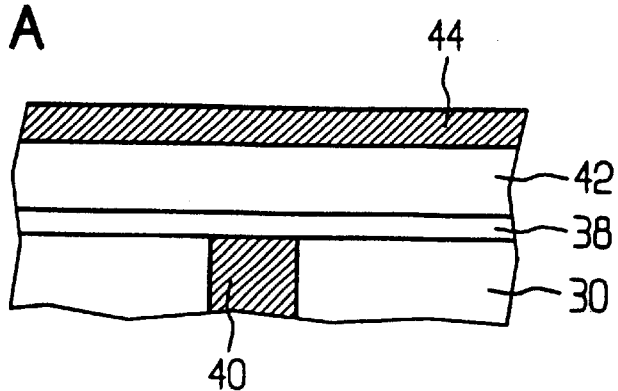
FIGS. 3a to 3d are fragmentary cross-sectional views of semiconductor structures illustrating method steps for fabricating a resistance element in the form of lateral edge webs.
Figure 3B:
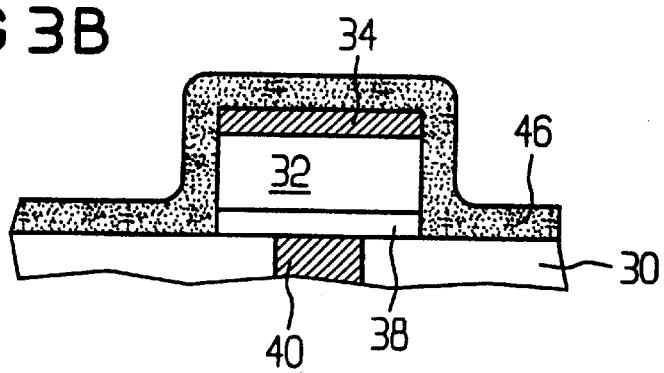
Figure 3C:
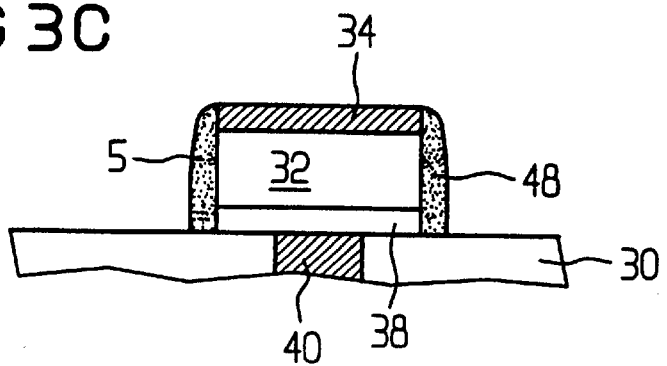
Figure 3D:
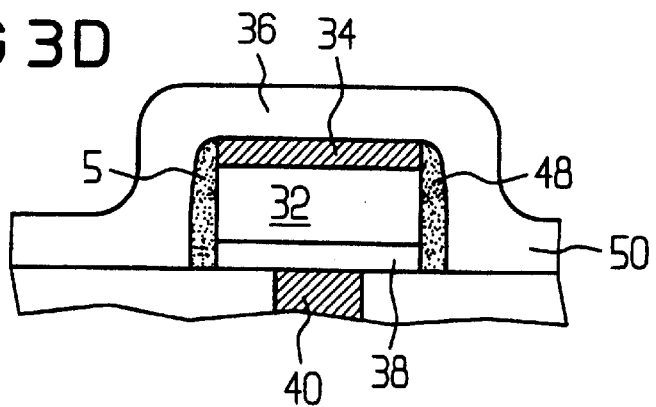

Individual method steps for fabricating the resistance element are described below. On the substrate 30, firstly a barrier layer 38 is applied, followed by an electrode material 42 and a metal oxide-containing layer 44. Preferably, these three layers 38, 42 and 44 are anisotropically etched jointly using an etching mask, the lower electrode 32 and the metal oxide layer 34 being formed in the process. A conformal polysilicon layer 46 is deposited, over the whole area, onto the structure obtained in this way and is subsequently etched anisotropically. As a result, lateral self-aligned edge webs 48 remain on the side areas or side regions of the metal oxide layer 34, of the barrier layer 38 and also of the lower electrode 32. These form the resistance element 5. The structure obtained is illustrated in FIG. 3c. Finally, a further electrode material 50 is deposited over the whole area, from which the second electrode 36 is formed. The thickness and the conductivity of the resistance element 5 are set such that the overall resistance of the resistance element 5 has a value between 10 and 100 MΩ.

Figure 4A:
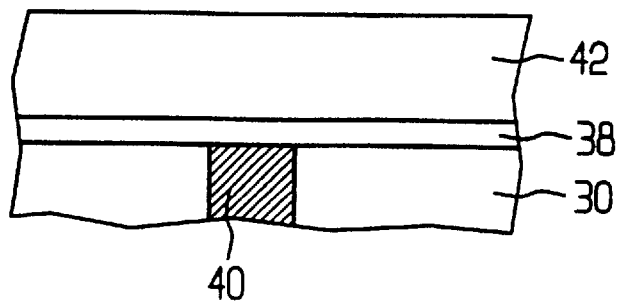
FIGS. 4a to 4d are fragmentary cross-sectional views of semiconductor structures illustrating method steps for forming the resistance element in the form of a contact hole.
Figure 4B:
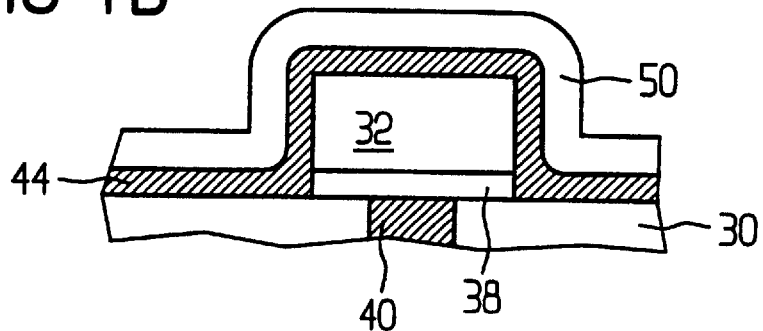
Figure 4C:
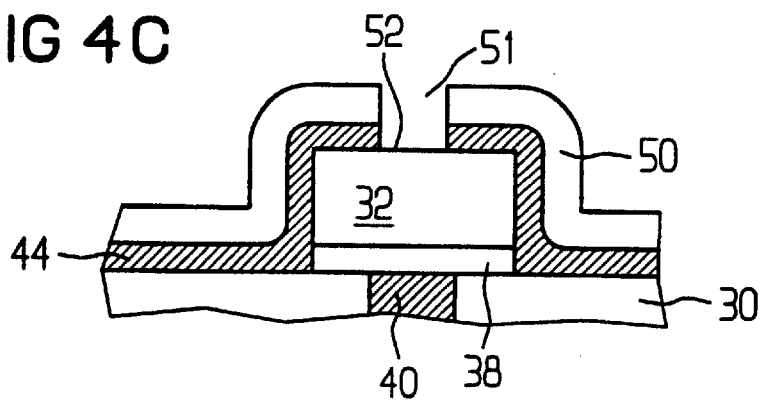
Figure 4D:
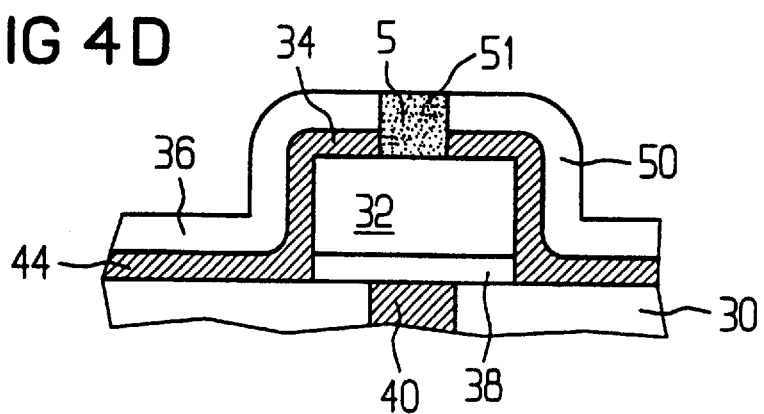

The steps for forming the resistance element 5 in the form of a contact hole are illustrated in FIGS. 4a to 4d. The starting point in this case is a structure as shown in FIG. 4a, in which the barrier layer 38 and the electrode material 42 are disposed on the substrate 30. The two layers 38 and 42 are subsequently etched and thus the barrier 38 and the lower electrode 32 are formed. The metal oxide-containing layer 44 and also the electrode material 50 are deposited onto the structure thus obtained. In a further process step, a contact hole 51 is etched through the metal oxide-containing layer 44 and the electrode material 50 on the top side 52 of the first electrode 32 and is filled with a conductive material. As a result, the structure illustrated in FIG. 4d is produced, in which the resistance element 5 in the form of a contact hole 51 filled with a conductive material, for example polysilicon, is situated on the top side 52 of the first electrode 32. In this embodiment, the electrode material 50 and the metal oxide-containing layer 44 constitute the upper electrode 36 and the metal oxide layer 34, respectively.

Figure 5A:
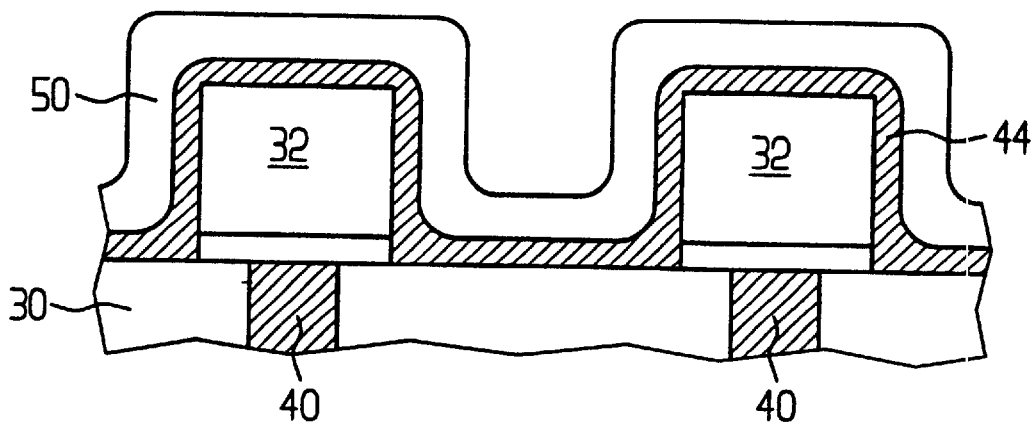
FIGS. 5a to 5c are fragmentary cross-sectional views of semiconductor structures illustrating method steps for forming the resistance element on the top side of the first electrode.
Figure 5B:
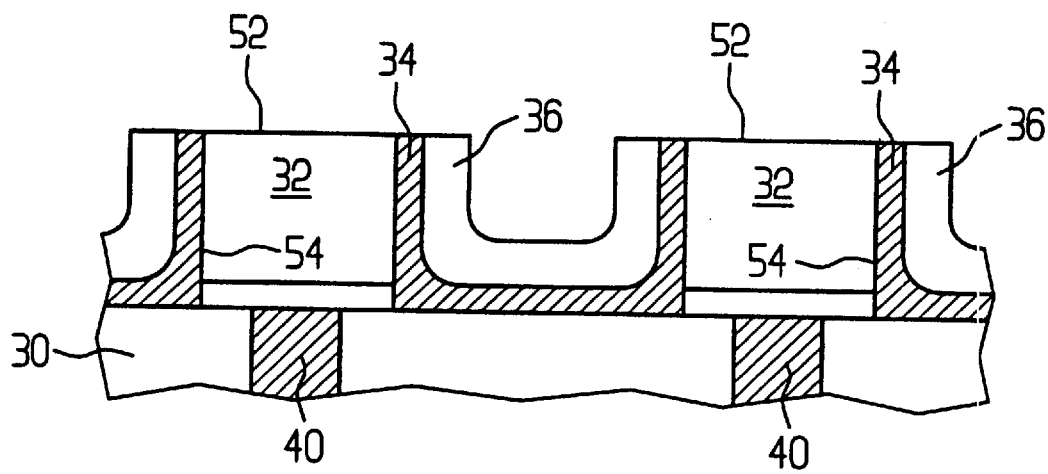
Figure 5C:
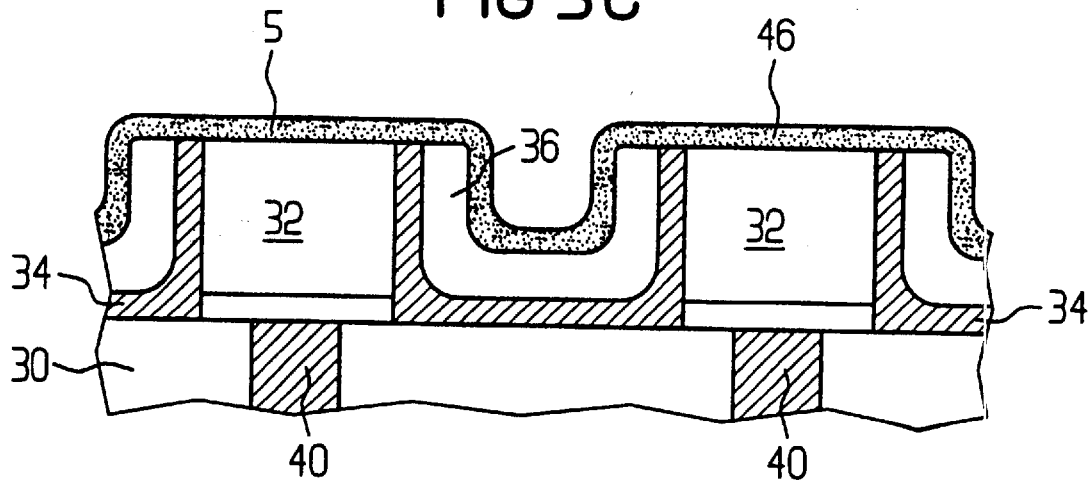

FIGS. 5a to 5c illustrate the method steps for fabricating a resistance element in the form of a conductive layer covering the entire top side of the first electrode. To that end, FIG. 5a illustrates two first electrodes 32 disposed on the top side of the substrate 30. These first electrodes are completely covered with the metal oxide-containing layer 44 and the electrode material 50. The metal oxide-containing layer 44 and also the electrode material 50 are removed from the top side 52 of the first electrodes 32 by a planarization step, for example by a so-called CMP step (chemical mechanical polishing). The metal oxide-containing layer 44 remaining on the side walls 54 of the first electrodes 32 and the electrode material 50 constitute the metal oxide layer 34 and the second electrodes 36, respectively. The resulting structure is illustrated in FIG. 5b. Subsequently, a polysilicon layer 46 having a predetermined material thickness and conductivity is deposited conformally onto the top side 52 of the first electrodes 32. In this process, electrical contact is established between the first electrodes 32 and the second electrodes 36, thereby enabling an equalization of a potential between the two electrodes for the purpose of preventing electrostatic charging. The polysilicon layer 46 constitutes the resistance element 5 in this exemplary embodiment.

Although the first electrodes 32 are now connected to one another by the polysilicon layer 46, a subsequent separation or interruption of the polysilicon layer 46 is not absolutely necessary but can optionally be effected. Since the resistance of the polysilicon layer 46 is sufficiently high, the polysilicon layer 46 does not influence, or influences only to an insignificant extent the writing of the remanent polarization to the metal oxide layer 46 by alterations in adjacent memory cells.

FIG. 6a is a plan view of four first electrodes 32, the top sides 52 thereof having been at least partly uncovered by an etching step, in other words the metal oxide layer 34 and the second electrodes 36 having been removed there. The uncovered region is indicated by dashes in FIG. 6a. The section along the line VI—VI is illustrated in FIG. 6b. It can clearly be seen that on the top side 52 of the first electrodes 32, only a partial region is free of the metal oxide layer 34 and the second electrode 36 and that a lateral edge web 49 is situated there on the side of the metal oxide layer 34 and of the second electrode 36. The edge web establishes a conductive connection between the second electrode 36 and the first electrode 32 and therefore serves as the resistance element 5. The top side 52 of the first electrode 32 is partly exposed, in other words it is exposed in given regions, through the use of a masked etching of the metal oxide layer 34 and of the second electrode 36 during which only the region illustrated by dashed lines in FIG. 6a is etched.

The fabrication of the resistance element in the metal oxide layer in FIGS. 7a to 7c and 8a to 8d is described below. Firstly a diffusion layer 60 is applied to the substrate 30. The lower electrode 32, which has been formed by the deposition of an electrode material and subsequent anisotropic etching, is seated on the diffusion layer. Before the application of the lower electrode, however, it is advantageous to etch a contact hole 40 through the diffusion layer 40 and the substrate 30 and fill it with a conductive material, so that the lower electrode 32 can be connected to the drain region 20 of the selection transistor 9. The deposition and etching of the diffusion layer 60 may optionally also be followed by the formation of the barrier layer 38.

The diffusion layer 60 contains diffusion substances, in particular metals, which are already contained in the metal oxide layer 34 that is to be produced subsequently. If the metal oxide layer is composed of SBT, the diffusion layer preferably contains bismuth. However, other metals are also possible, for example ruthenium, iron, tantalum, and titanium, which preferably concentrate at the grain boundaries of the polycrystalline SBT layer that forms, and thus contribute to locally altering the conductivity of the SBT layer.

Figure 7A:
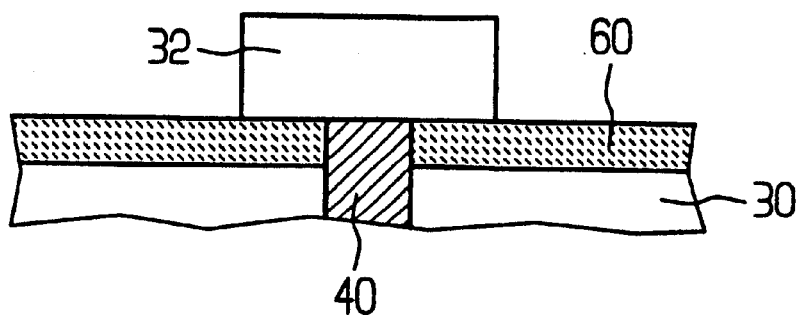
FIGS. 7a to 7c are fragmentary cross-sectional views of semiconductor structures illustrating method steps for forming the resistance element in the form of a conductive region of the metal oxide layer.
Figure 7B:
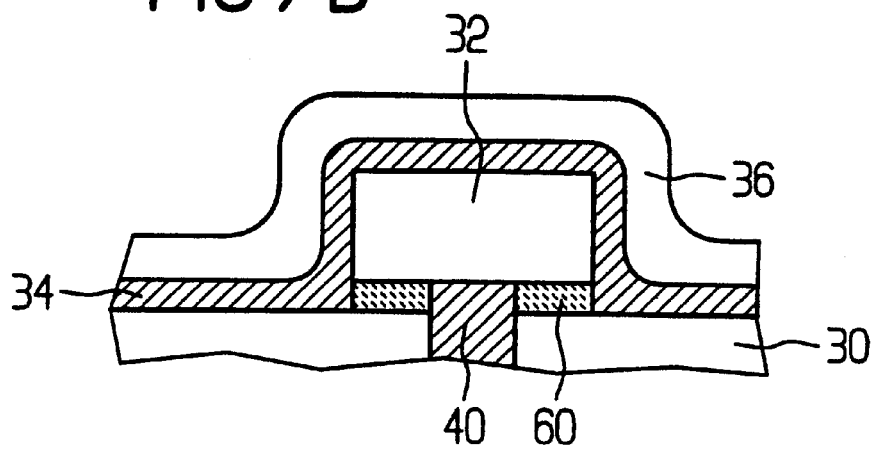
Figure 7C:
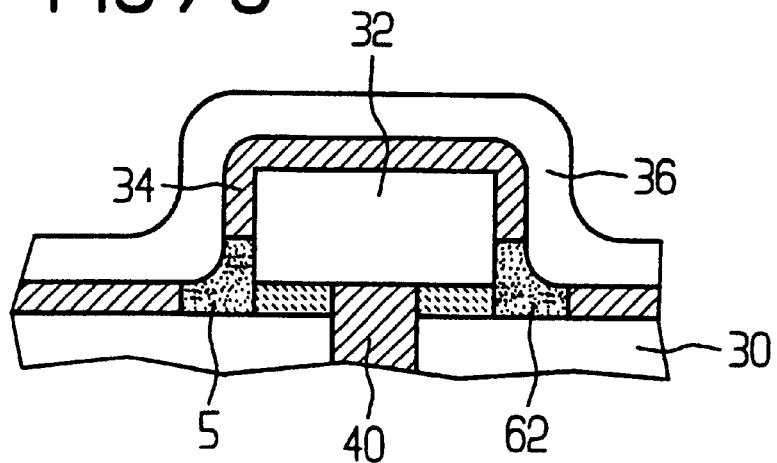
Figure 8A:
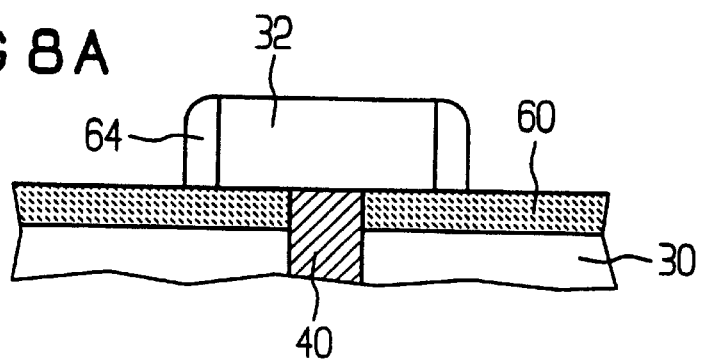
FIGS. 8a to 8d are fragmentary cross-sectional views of semiconductor structures illustrating method steps for forming a resistance element in the form of conductive regions in the metal oxide layer using a diffusion layer which protrudes from under the first electrode.
Figure 8B:
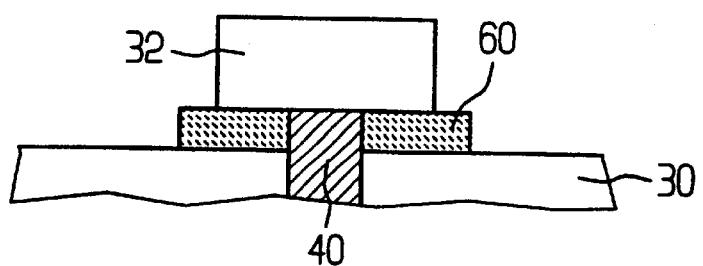
Figure 8C:
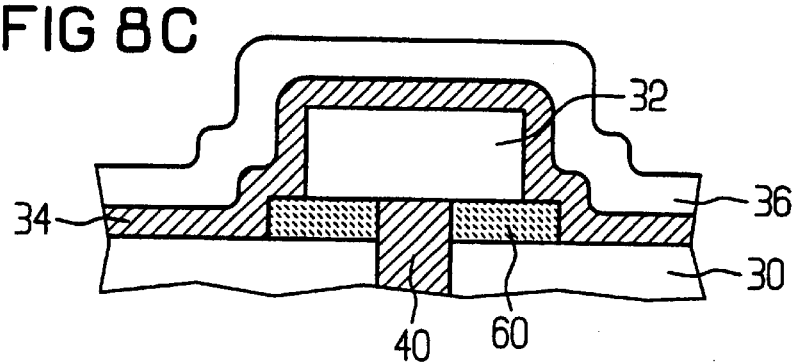
Figure 8D:
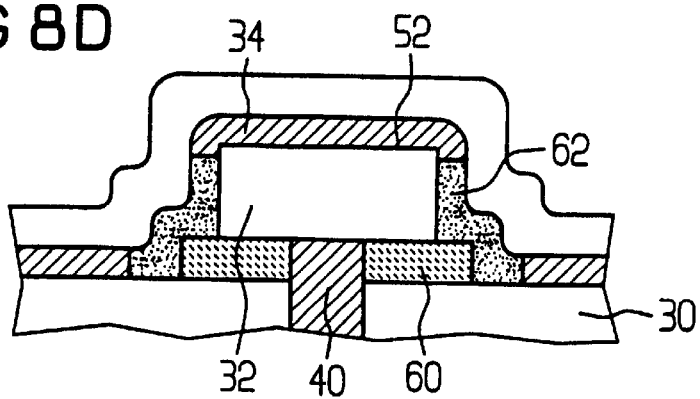

Before the deposition of the metal oxide layer 34, however, the diffusion layer 60 is firstly etched using the lower electrode 32 as a mask. The metal oxide layer 34 and the upper electrode 36 are applied to the structure thus obtained, as shown in FIG. 7b. The diffusion layer 60 has an area of contact with the metal oxide layer 34 that differs in size depending on the material thickness of the diffusion layer 60. The size of the contact area determines, inter alia, during the subsequent heat treatment, the size of the resistance element to be formed. During this heat treatment, the diffusion substances in the diffusion layer 60 are activated and diffuse into the metal oxide layer 34, where they form at least one conductive region 62. The heat treatment may, for example, be simultaneously combined with an annealing step necessary for producing the ferroelectric properties of the metal oxide layer. Since ferroelectric capacitors are usually subjected to a plurality of heat treatments in the course of their production, an additional heat-treatment step is not necessarily required in order to form the conductive regions 62 in the metal oxide layer 34.

The extent of the conductive regions 62 and the conductivity thereof greatly depend on the quantity of the diffusion substances which diffuse into the metal oxide layer. This quantity is determined inter alia by the diffusion substance concentration in the diffusion layer 60, the contact area between diffusion layer 60 and metal oxide layer 34, and also on the selected temperature and duration of the individual heat treatments. As a result, these parameters should be chosen suitably in order to achieve the preferably sought resistance between 10 MΩ and 100 MΩ. In the embodiment that is presented here, the conductive regions 62, which constitute the resistance element 5 in this case, extend in one part annularly in the lower region of the lower electrode 32 around the latter. Depending on the extent of the conductive regions 62 along the lower electrode 32, these have an effective resistive area by which the first electrode 32 and the second electrode 36 are connected to one another in order to achieve an equalization of a potential. Preferably, the extent of the conductive region 62 is chosen to be relatively small, so that the area of the first electrode 32 which is necessary for the storage function is not excessively restricted. Moreover, the conductivity of the metal oxide layer 34 should be altered only within the conductive region, since the ferroelectric properties of the metal oxide layer 34 can be adversely affected by altering the stoichiometric ratios of the metal oxide layer 34 and/or by incorporating impurity atoms into the metal oxide lattice.

If, however, the intention is to deliberately increase the contact area between the diffusion layer 60 and the capacitor dielectric, it is recommended to use a sacrificial layer 64, which is conformally deposited after the formation of the first electrode 32 and anisotropically etched, with the result that the sacrificial layer 64 remains on the side of the first electrode 32 in the form of one or more edge webs 64. These edge webs 64, together with the lower electrode 32, serve as an etching mask for the etching of the diffusion layer 60. Consequently, the latter has a larger lateral extent than the first electrode 32 and, after the removal of the sacrificial layer 64, protrudes from under the electrode by the width of the sacrificial layer 64. The contact area between the diffusion layer 60 and the metal oxide layer 34 is thus enlarged and consequently leads to a significantly enlarged conductive region 62 during the subsequent heat treatment. If desired, the conductive regions 62 can also extend to a point near the top side 52 of the first electrode 32.

Figure 9A:
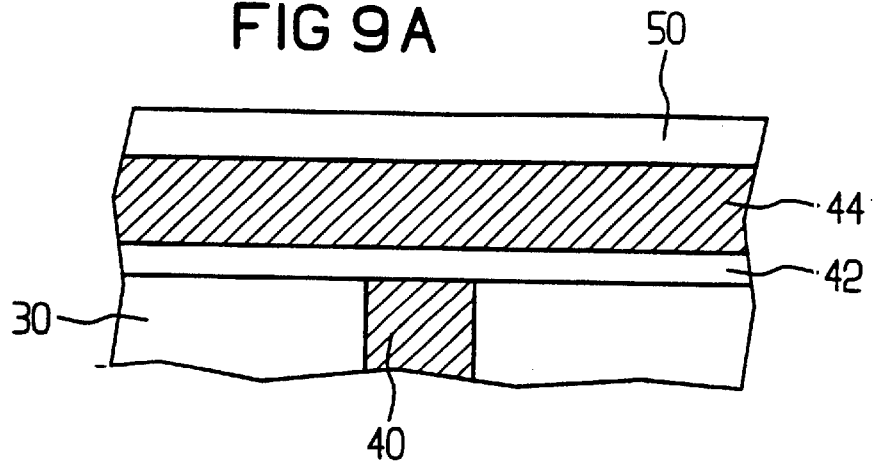
FIGS. 9a to 9c are fragmentary cross-sectional views of semiconductor structures illustrating method steps for forming a resistance element by ion implantation.
Figure 9B:
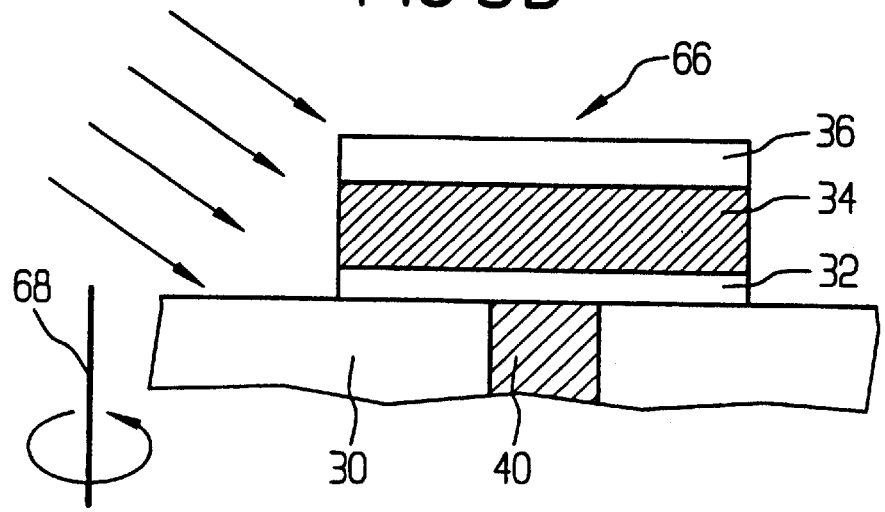
Figure 9C:
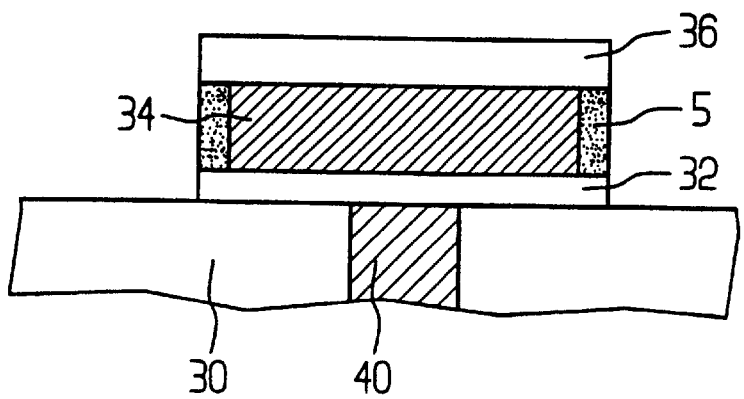

The fabrication of a resistance element through the use of ion implantation will be described below with reference to FIGS. 9a to 9c. In a first method step, an electrode material 42, a metal oxide-containing layer 44 and a further electrode material 50 are deposited onto a substrate 30 that is provided. This is followed by a preferred common etching process in which a layer stack 66 is produced which includes the lower electrode 32, the metal oxide layer 34, and the upper electrode 36 formed with the etching process. The structure thus obtained is shown in FIG. 9b.

A further method step serves for the implantation of ions, for example of titanium or strontium, into the metal oxide layer (SBT layer) 34. This is indicated by the arrows shown in FIG. 9b. The implantation is preferably carried out in an inclined manner, so that the ions are implanted laterally into the metal oxide layer 34. The electrodes 32 and 36 adjoining the metal oxide layer 34 protect the metal oxide layer 34 against a whole-area implantation. The implantation can be carried out on one side or on the entire side area of the metal oxide layer 34. In the case of the former variant, the resistance element 5 to be formed occupies only a relatively small space. If, on the other hand, the implantation is carried out on the entire side area, although the space requirement is higher, in return the ion dose can be reduced, which results in a reduced disturbance of the metal oxide layer. The implantation is preferably carried out with the layer stack 66 being rotated about an axis 68 of rotation oriented perpendicularly to the stack.

Finally, a heat treatment is carried out in which the implanted ions are activated and the lattice disturbed by the implantation is annealed. As a result, a resistance element 5 is produced in the side region of the metal oxide layer 34.

We claim:

1. A semiconductor component, comprising:
   a capacitor having a first electrode, a second electrode, and a metal oxide layer disposed between said first electrode and said second electrode, said metal oxide layer having a first resistance and being remanently electrically polarizable by a given voltage difference between said first electrode and said second electrode; and
   a resistance element disposed at said capacitor and electrically connecting said first electrode to said second electrode, said resistance element having a second resistance smaller than said first resistance.

2. The semiconductor component according to claim 1, wherein said second resistance is dimensioned for substantially preventing an unintentional charging of said first electrode and said second electrode with respect to one another.

3. The semiconductor component according to claim 1, wherein said second resistance has a value of approximately between 1 MΩ and 100 GΩ.

4. The semiconductor component according to claim 1, wherein said second resistance has a value of approximately between 10 MΩ and 100 MΩ.

5. The semiconductor component according to claim 1, wherein said resistance element is formed of a substance selected from the group consisting of a polysilicon, a conductive nitride, and a silicide.

6. The semiconductor component according to claim 1, wherein said metal oxide layer has at least one side surface and said resistance element is configured as a self-aligned lateral edge web disposed on said at least one side surface.

7. The semiconductor component according to claim 1, wherein said metal oxide layer is formed with a contact hole filled with a conductive material, said resistance element is formed by said conductive material disposed in said contact hole.

8. The semiconductor component according to claim 1, wherein said first electrode has a top side and a side surface, and including a layer of conductive material entirely covering said top side of said first electrode and covering said second electrode at least at said side surface, said metal oxide layer being interposed between said side surface of said first electrode and said second electrode, and said resistance element being formed by said layer of conductive material.

9. The semiconductor component according to claim 1, wherein said metal oxide layer has at least one region with an altered resistance and said resistance element is formed by said at least one region with said altered resistance.

10. The semiconductor component according to claim 9, wherein said at least one region with said altered resistance includes at least one diffusion substance introduced into said at least one region by an in-diffusion.

11. The semiconductor component according to claim 10, wherein said metal oxide layer contains a given type of metal and said at least one diffusion substance is composed of said given type of metal.

12. The semiconductor component according to claim 10, wherein said at least one diffusion substance is at least one metal selected from the group consisting of bismuth, strontium, niobium, lead, tantalum, titanium, ruthenium, iron, and zirconium.

13. The semiconductor component according to claim 9, wherein said at least one region with said altered resistance includes an ion-implanted substance.

14. The semiconductor component according to claim 13, wherein said ion-implanted substance is at least one metal selected from the group consisting of bismuth, strontium, niobium, lead, tantalum, titanium, ruthenium, iron, and zirconium.

15. The semiconductor component according to claim 1, wherein said metal oxide layer is formed of a substance selected from the group consisting of strontium-bismuth-tantalate, niobium-doped strontium-bismuth-tantalate, and lead-zirconium-titanate.

* * * * *